(12) United States Patent
Kato

(10) Patent No.: US 10,340,327 B2
(45) Date of Patent: Jul. 2, 2019

(54) DISPLAY DEVICE

(71) Applicant: Japan Display Inc., Minato-ku (JP)

(72) Inventor: Kengo Kato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/981,201

(22) Filed: May 16, 2018

(65) Prior Publication Data

US 2018/0366531 A1 Dec. 20, 2018

(30) Foreign Application Priority Data

Jun. 15, 2017 (JP) ................................. 2017-117705

(51) Int. Cl.
| | |
|---|---|
| *H01L 27/32* | (2006.01) |
| *H01L 51/00* | (2006.01) |
| *H01L 51/52* | (2006.01) |
| *H01L 27/12* | (2006.01) |

(52) U.S. Cl.
CPC ...... *H01L 27/3276* (2013.01); *H01L 27/3258* (2013.01); *H01L 51/0097* (2013.01); *H01L 51/5253* (2013.01); *H01L 27/124* (2013.01); *H01L 27/1218* (2013.01); *H01L 27/1248* (2013.01); *H01L 27/3262* (2013.01); *H01L 2251/5338* (2013.01)

(58) Field of Classification Search
CPC ............ H01L 27/3276; H01L 51/0097; H01L 51/5253; H01L 27/3258
See application file for complete search history.

(56) References Cited

U.S. PATENT DOCUMENTS

| | | | |
|---|---|---|---|
| 9,923,156 B2* | 3/2018 | Jeong | H01L 51/0097 |
| 2014/0139102 A1* | 5/2014 | Jeon | H01L 27/3246 313/504 |
| 2018/0158893 A1* | 6/2018 | Tokuda | H05B 33/0806 |

FOREIGN PATENT DOCUMENTS

JP 2016-31499 3/2016

* cited by examiner

*Primary Examiner* — Dung A. Le
(74) *Attorney, Agent, or Firm* — Oblon, McClelland, Maier & Neustadt, L.L.P.

(57) ABSTRACT

A display device according to an embodiment of the present invention includes a base material containing resin and including a display region and a bent region, the display region including a plurality of pixels; and a resin layer disposed on one side of the base material. An exposed section where a surface of the resin layer on a side opposite to a side on which the base material is disposed is exposed is formed in at least the bent region, and the resin layer includes, in the exposed section, a first resin layer and a second resin layer whose hydrophilicity is lower than that of the first resin layer, in this order from the base material side.

6 Claims, 5 Drawing Sheets

DISPLAY DEVICE

CROSS-REFERENCE TO RELATED APPLICATION

The present application claims priority from Japanese Application JP2017-117705 filed on Jun. 15, 2017, the content of which is hereby incorporated by reference into this application.

BACKGROUND OF THE INVENTION

1. Field of the Invention

One or more embodiments of the present invention relate to a display device.

2. Description of the Related Art

In a display device including a display region, such as an organic electroluminescent (EL) display device or a liquid crystal display device, the development of a flexible display in which a display panel can be bent has recently progressed with the use of a base material having flexibility.

For example, as disclosed in JP 2016-31499 A, it is proposed to achieve a narrower picture-frame by bending a mounting section of an integrated circuit (IC) or a flexible printed circuit (FPC) to the rear side of the display region.

SUMMARY OF THE INVENTION

However, when the display panel is bent, a trouble such as a lighting failure tends to occur.

One or more embodiments of the present invention have been made in view of the above, and an object thereof is to provide a display device in which the occurrence of a lighting failure is suppressed.

According to one aspect of the present invention, a display device is provided. The display device includes a base material containing resin and including a display region and a bent region, the display region including a plurality of pixels; and a resin layer disposed on one side of the base material. An exposed section where a surface of the resin layer on a side opposite to a side on which the base material is disposed is exposed is formed in at least the bent region, and the resin layer includes, in the exposed section, a first resin layer and a second resin layer whose hydrophilicity is lower than that of the first resin layer, in this order from the base material side.

DETAILED DESCRIPTION OF THE INVENTION

Figure 1:
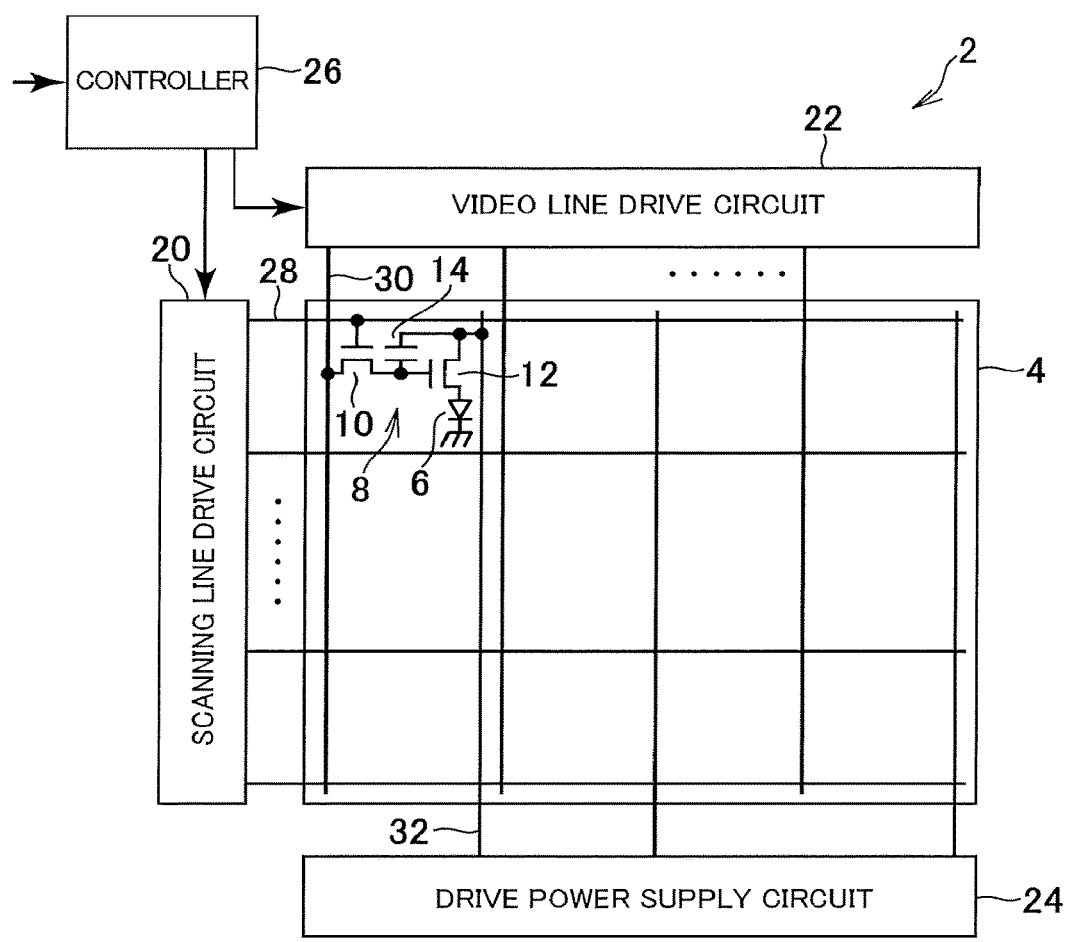
FIG. 1 is a schematic view showing a schematic configuration of an organic EL display device according to one embodiment of the invention.

Hereinafter, embodiments of the invention will be described with reference to the drawings. The disclosure is illustrative only. Appropriate modifications that will readily occur to those skilled in the art and fall within the spirit of the invention are of course included in the scope of the invention. In the drawings, the width, thickness, shape, and the like of each part may be schematically represented, compared to those in practicing aspects of the invention, for more clarity of description. However, they are illustrative only, and do not limit the interpretation of the invention. Moreover, in the specification and the drawings, elements similar to those described in relation to a previous drawing are denoted by the same reference numerals and signs, and a detailed description may be appropriately omitted.

FIG. 1 is a schematic view showing a schematic configuration of a display device according to one embodiment of the invention, showing an organic EL display device as an example. The organic EL display device 2 includes a pixel array section 4 that displays an image, and a drive section that drives the pixel array section 4. The organic EL display device 2 is a flexible display using a resin film as a base material. A stacked structure of thin film transistors (TFTs), organic light emitting diodes (OLEDs), and the like is formed on the base material composed of the resin film. The schematic view shown in FIG. 1 is illustrative only, and the embodiment is not limited to this configuration.

In the pixel array section 4, OLEDs 6 and pixel circuits 8 are disposed in a matrix so as to correspond to pixels. The pixel circuit 8 includes a plurality of TFTs 10 and 12 and a capacitor 14.

The drive section includes a scanning line drive circuit 20, a video line drive circuit 22, a drive power supply circuit 24, and a controller 26. The drive section drives the pixel circuit 8 and controls emission of the OLED 6.

The scanning line drive circuit 20 is connected to scanning signal lines 28 each provided for an array of pixels in the horizontal direction (a pixel row). The scanning line drive circuit 20 sequentially selects the scanning signal line 28 in response to a timing signal input from the controller 26, and applies a voltage for turning on the lighting TFT 10 to the selected scanning signal line 28.

The video line drive circuit 22 is connected to video signal lines 30 each provided for an array of pixels in the vertical direction (a pixel column). The video line drive circuit 22 receives a video signal from the controller 26, and outputs, in synchronization with the selection of the scanning signal line 28 by the scanning line drive circuit 20, a voltage in response to the video signal of the selected pixel row to each of the video signal lines 30. The voltage is written to the capacitor 14 via the lighting TFT 10 in the selected pixel row. The drive TFT 12 supplies a current in response to the written voltage to the OLED 6, and thus the OLED 6 of the pixel corresponding to the selected scanning signal line 28 emits light.

The drive power supply circuit 24 is connected to drive power supply lines 32 each provided for the pixel column, and supplies a current to the OLED 6 via the drive power supply line 32 and the drive TFT 12 in the selected pixel row.

Here, a lower electrode of the OLED 6 is connected to the drive TFT 12. On the other hand, upper electrodes of the OLEDs 6 are composed of an electrode common to the OLEDs 6 of all pixels. When the lower electrode is configured as an anode, a high potential is input thereto and a low potential is input to the upper electrode that serves as a cathode. When the lower electrode is configured as a cathode, a low potential is input thereto and a high potential is input to the upper electrode that serves as an anode.

Figure 2:
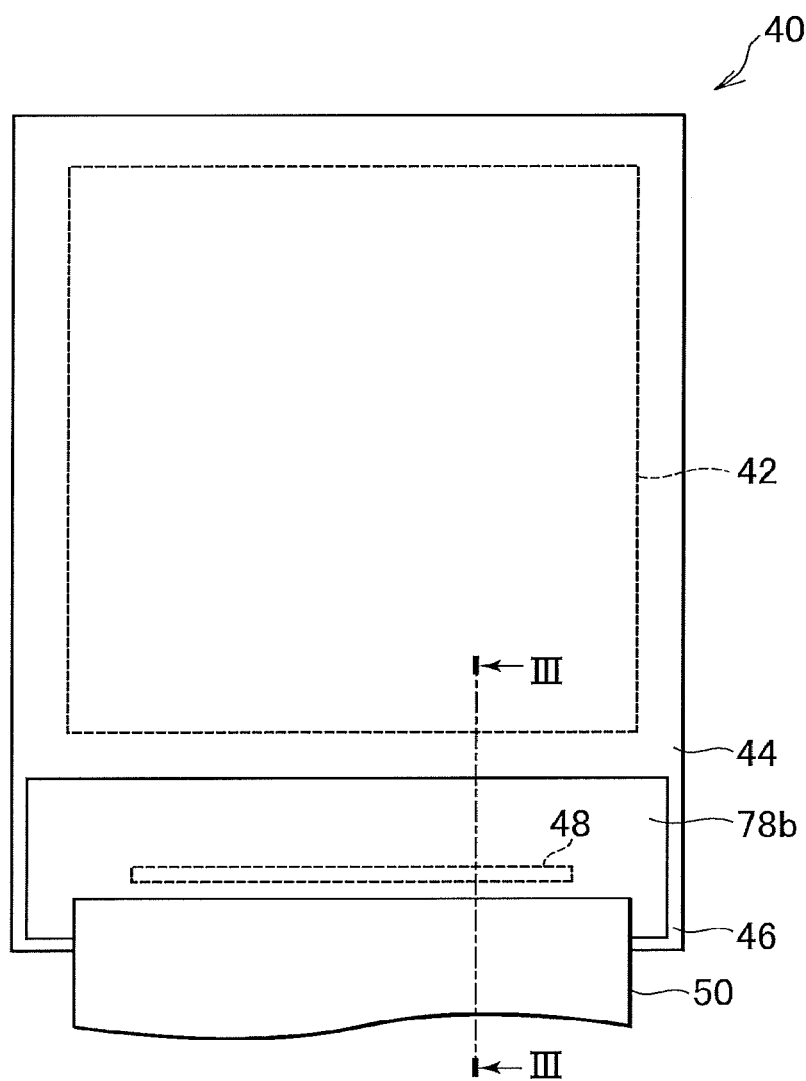
FIG. 2 is a schematic plan view showing an example of a display panel of the organic EL display device shown in FIG. 1.

FIG. 2 is a schematic plan view showing an example of a display panel of the organic EL display device shown in FIG. 1. The pixel array section 4 shown in FIG. 1 is provided in a display region 42 of the display panel 40, and the OLEDs 6 are arranged in the pixel array section 4 as described above. The upper electrode constituting the OLED 6 is formed in common to the pixels as described above, and covers the entire display region 42.

A component mounting region 46 is provided at one side of the display panel 40 having a rectangular shape, and a wiring line connected to the display region 42 is disposed at the side. A driver IC 48 constituting the drive section is mounted on the component mounting region 46, and an FPC 50 is connected thereto. The FPC 50 is connected to the controller 26, the circuits 20, 22, and 24, and the like, and an IC is mounted on the FPC 50.

Figure 3:
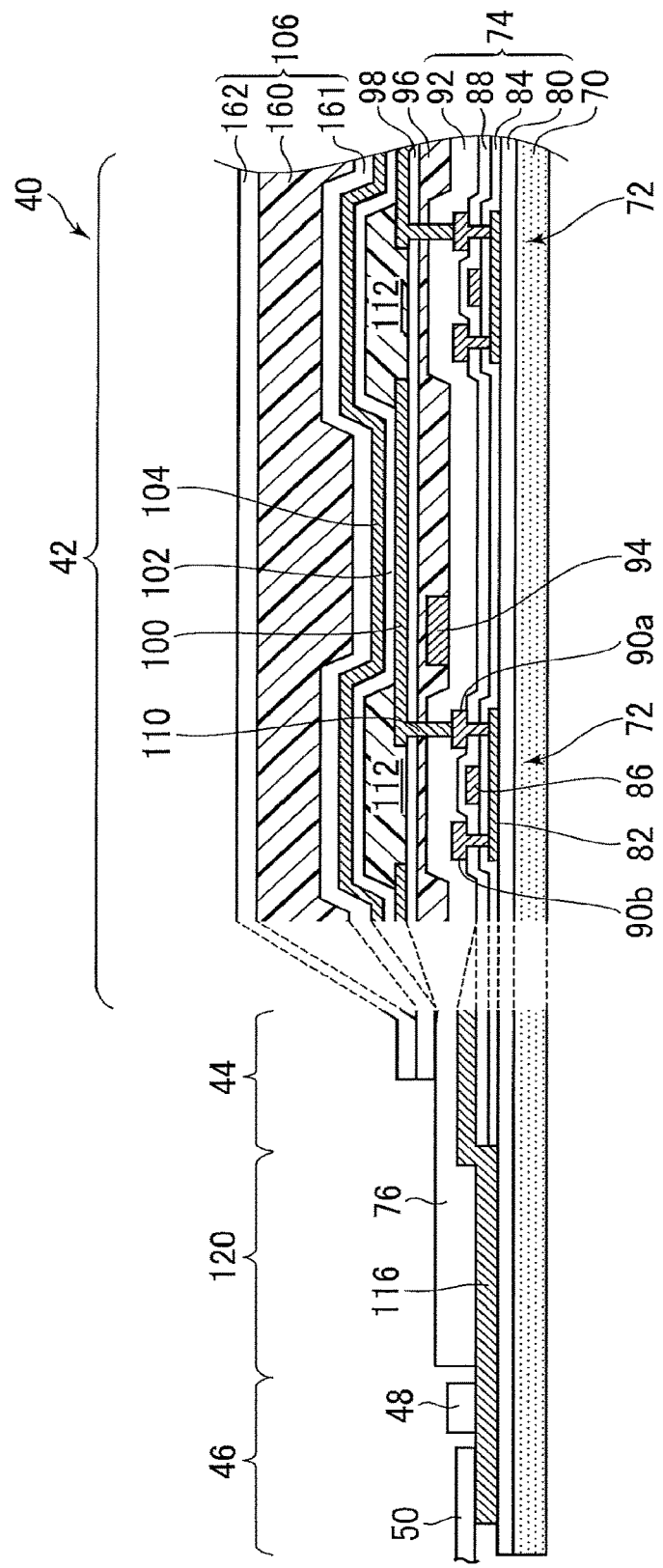
FIG. 3 is a diagram showing an example of a cross-section taken along line in FIG. 2.

FIG. 3 is a diagram showing an example of a cross-section taken along line in FIG. 2. The display panel 40 has a structure in which a circuit layer 74 including TFTs 72 formed therein, the OLEDs 6, a sealing layer 106 sealing the OLEDs 6, and the like are stacked on a base material 70 composed of a resin film. Examples of the resin constituting the base material 70 include, for example, a polyimide-based resin. The thickness of the base material 70 is, for example, from 10 μm to 20 μm. A protective layer (not shown) is formed on the sealing layer 106. In the embodiment, the pixel array section 4 is of a top-emission type, and light generated in the OLED 6 is emitted to the side (upward in FIG. 3) opposite to the base material 70 side. When a color filter system is employed as a coloring system in the organic EL display device 2, a color filter is disposed, for example, between the sealing layer 106 and the protective layer (not shown), or on a counter substrate side. White light generated by the OLED 6 transmits through the color filter, so that, for example, red (R), green (G), and blue (B) lights are produced.

The pixel circuit 8, the scanning signal line 28, the video signal line 30, the drive power supply line 32, and the like, which are described above, are formed in the circuit layer 74 in the display region 42. At least a portion of the drive section can be formed as the circuit layer 74 on the base material 70 in a region adjacent to the display region 42. As described above, the driver IC 48 and the FPC 50, which constitute the drive section, can be connected to a wiring line 116 of the circuit layer 74 in the component mounting region 46.

As shown in FIG. 3, an under layer 80 formed of an inorganic insulating material is disposed on the base material 70. As the inorganic insulating material, for example, silicon nitride ($SiN_y$), silicon oxide ($SiO_x$), and a complex of these materials are used. The under layer 80 may be a single layer body or a stacked body.

In the display region 42, a semiconductor region 82 serving as a channel section and a source-drain section of the TFT 72 of a top-gate type is formed on the base material 70 with the under layer 80 between the semiconductor region 82 and the base material 70. The semiconductor region 82 is formed of, for example, polysilicon (p-Si). The semiconductor region 82 is formed by, for example, providing a semiconductor layer (p-Si film) on the base material 70, and patterning the semiconductor layer while selectively leaving portions to be used in the circuit layer 74.

A gate electrode 86 is disposed on the channel section of the TFT 72 with a gate insulating film 84 between the gate electrode 86 and the channel section. The gate insulating film 84 is typically formed of TEOS. The gate electrode 86 is formed by, for example, patterning a metal film formed by sputtering or the like. An interlayer insulating layer 88 is disposed on the gate electrode 86 so as to cover the gate electrode 86. The interlayer insulating layer 88 is formed of, for example, the above inorganic insulating material. An impurity is introduced by ion implantation into the semiconductor region 82 (p-Si) serving as the source-drain section of the TFT 72, and further, a source electrode 90a and a drain electrode 90b that are electrically connected to the source-drain section are formed, so that the TFT 72 is configured.

An interlayer insulating film 92 is disposed on the TFT 72. A wiring line 94 is disposed on the surface of the interlayer insulating film 92. The wiring line 94 is formed by, for example, patterning a metal film formed by sputtering or the like. For example, the scanning signal line 28, the video signal line 30, and the drive power supply line 32, which are shown in FIG. 1, and the wiring line 116 can be formed to have a multilayer wiring structure using the metal film forming the wiring line 94 and the metal film used for forming the gate electrode 86, the source electrode 90a, and the drain electrode 90b. On this configuration, a planarization film 96 and a passivation film 98 are formed using a resin material or the like. The OLED 6 is formed on the passivation film 98 in the display region 42. The passivation film 98 is formed of, for example, an inorganic insulating material such as $SiN_y$.

The OLED 6 includes a lower electrode 100, an organic material layer 102, and an upper electrode 104. Specifically, the organic material layer 102 includes a hole transport layer, a light emitting layer, and an electron transport layer. The OLED 6 is typically formed by stacking the lower electrode 100, the organic material layer 102, and the upper electrode 104 in this order from the base material 70 side. In the embodiment, the lower electrode 100 is an anode of the OLED 6, and the upper electrode 104 is a cathode thereof.

When it is assumed that the TFT 72 shown in FIG. 3 is the drive TFT 12 having an n-channel, the lower electrode 100 is connected to the source electrode 90a of the TFT 72. Specifically, after the formation of the planarization film 96 described above, a contact hole 110 for connecting the lower electrode 100 to the TFT 72 is formed, and for example, by patterning a conductor section 111 formed on the surface of the planarization film 96 and inside the contact hole 110, the lower electrode 100 connected to the TFT 72 is formed for each pixel. The lower electrode is formed of, for example, a transmitting conductive material such as indium tin oxide (ITO) or indium zinc oxide (IZO), or metal such as Ag or Al.

On the above structure, a rib 112 separating the pixels is disposed. For example, after the formation of the lower electrode 100, the rib 112 is formed at the boundary between the pixels, and the organic material layer 102 and the upper electrode 104 are stacked in an effective region (a region where the lower electrode 100 is exposed) of the pixel surrounded by the rib 112. The upper electrode 104 is formed of, for example, an extremely thin alloy of Mg and Ag, or a transmitting conductive material such as ITO or IZO.

The sealing layer 106 is disposed on the upper electrode 104 so as to cover the entire display region 42. The sealing layer 106 has a stacked structure including a first sealing film 161, a sealing planarization film 160, and a second sealing film 162 in this order. The first sealing film 161 and the second sealing film 162 are formed of an inorganic material (e.g., an inorganic insulating material). Specifically, the first sealing film 161 and the second sealing film 162 are formed by depositing a SiN$_y$ film by a chemical vapor deposition (CVD) method. The sealing planarization film 160 is formed using an organic material (e.g., a resin material such as a curable resin composition). On the other hand, the sealing layer 106 is not disposed in a bent region 120 and the component mounting region 46.

An insulating layer 76 is formed on the wiring line 116 (the drive power supply line 32, the scanning signal line 28, and the video signal line 30). The insulating layer 76 is formed in forming, for example, the inorganic insulating film (e.g., the interlayer insulating layer 88, the interlayer insulating film 92, or the passivation film 98) and/or the resin film (e.g., the planarization film 96) in the display region 42.

Figure 4:
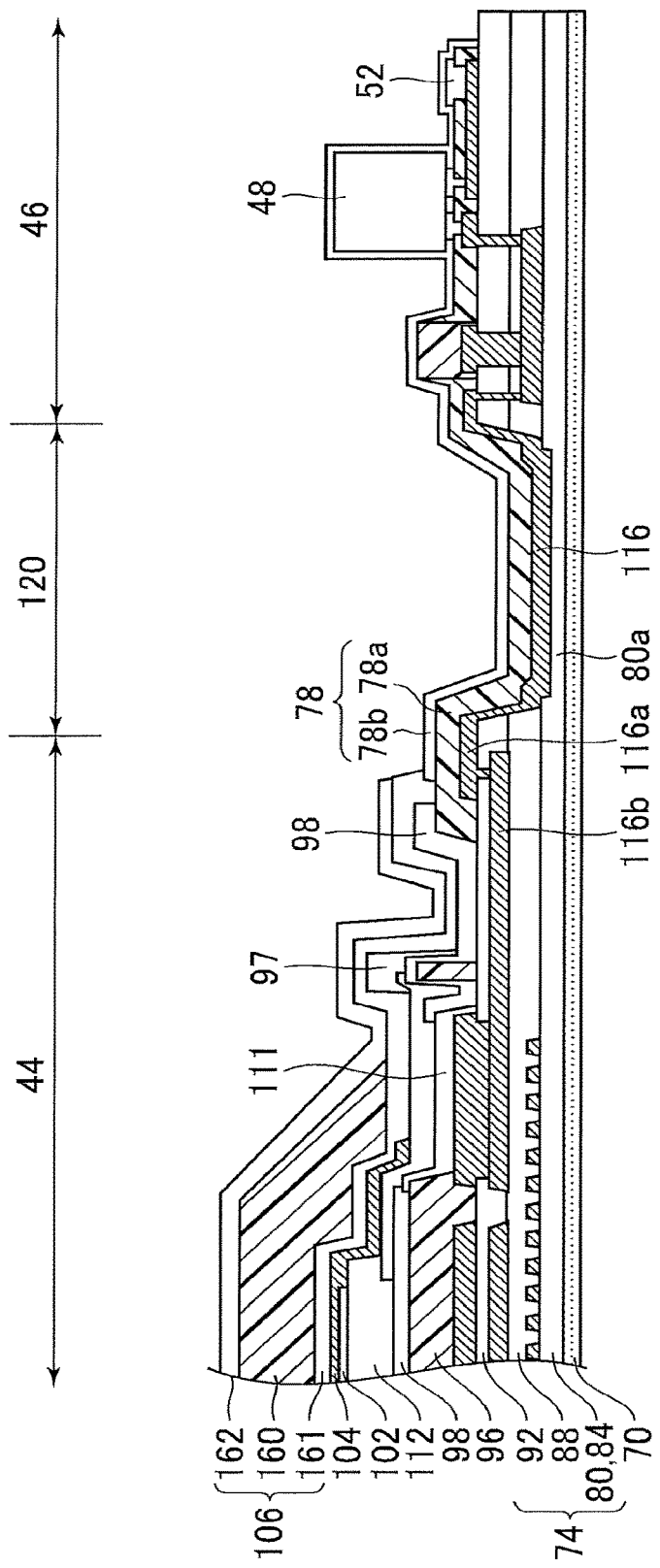
FIG. 4 is a diagram showing an example of a cross-section of a bent region and its vicinity of the display panel shown in FIG. 2.

FIG. 4 is a diagram showing an example of a cross-section of the bent region and its vicinity of the display panel shown in FIG. 2. Specifically, FIG. 4 shows in detail an edge portion of a picture-frame region 44, the bent region 120, and the component mounting region 46 shown in FIG. 3. The picture-frame region 44 is a region that surrounds the display region 42. Compared to the display region 42, the picture-frame region 44 differs therefrom in that, for example, the picture-frame region 44 does not include the TFT 72 and the OLED 6. The display panel 40 may be manufactured with the base material 70 maintained in a flat plane form as shown in FIG. 3. However, for example, when the display panel 40 is stored in a housing of the organic EL display device 2, the component mounting region 46 is disposed on the rear side of the display region 42 with the bent region 120 provided outside the display region 42.

The circuit layer 74 including electrical wiring lines formed therein, the passivation film 98, and the sealing layer 106 are formed in this order on the base material 70 in the picture-frame region 44. Moreover, in the picture-frame region 44, a dam 97 surrounding the display region 42 is formed on the circuit layer 74, and the first sealing film 161 and the second sealing film 162 are formed so as to cover the dam 97. The sealing planarization film 160 is contained inside (the display region 42 side) the dam 97. The dam 97 has, for example, the role of preventing the forming material of the sealing planarization film 160 from spreading outward in forming the sealing planarization film 160. The dam 97 is typically formed using a resin material in a line shape so as to have predetermined width and height. In one embodiment, the dam 97 is formed in forming the planarization film 96 and/or the rib 112 in the display region 42.

At least a portion of the layers (e.g., the under layer 80, the interlayer insulating layer 88, the interlayer insulating film 92, and the passivation film 98) formed of an inorganic insulating material is preferably omitted or made into a thin film in the bent region 120. This is because the layer formed of an inorganic insulating material tends to be broken by bending. In the illustrated example, the wiring line 116 is disposed on the under layer 80 that is made into a thin film (specifically, a thinned region 80$a$ partially formed by etching or the like) in the bent region 120.

In the bent region 120, a resin layer 78 is formed so as to directly cover the wiring line 116, and the surface of the resin layer 78 is exposed. The resin layer 78 includes a first resin layer 78$a$ and a second resin layer 78$b$ in this order from the base material 70 side. The second resin layer 78$b$ is formed such that the hydrophilicity of the second resin layer 78$b$ is lower than that of the first resin layer 78$a$. For example, the second resin layer 78$b$ is formed of a resin material different in composition, the kind of a contained resin, and the like from a resin material forming the first resin layer 78$a$. As a specific example, the first resin layer 78$a$ is formed of a polyimide-based resin and/or an acrylic-based resin, and the second resin layer 78$b$ is formed of a styrene-based resin. The hydrophilicity of each resin layer can also be adjusted by, for example, introducing a modifying group into the forming material. By including a layer with low hydrophilicity on the front side of the resin layer 78, the entry of moisture into the interior of the resin layer 78 can be suppressed.

The first resin layer 78$a$ is formed in, for example, forming the planarization film 96 in the display region 42. In this case, the first resin layer 78$a$ and the planarization film 96 have substantially the same composition. In the illustrated example, the first resin layer 78$a$ is formed so as to be thinner in thickness (e.g., approximately half and approximately 3 μm) than the planarization film 96.

The second resin layer 78$b$ is formed on the first resin layer 78$a$. In the illustrated example, the second resin layer 78$b$ is not formed on the sealing layer 106 formed in the display region 42 and the picture-frame region 44. In the component mounting region 46, the second resin layer 78$b$ is formed so as to cover an edge portion of the first resin layer 78$a$ in order to, for example, effectively suppress the entry of the moisture. The second resin layer 78$b$ is formed by, for example, applying a resin composition containing a base resin (e.g., a styrene-based resin) and a solvent (e.g., an aliphatic hydrocarbon-based organic solvent such as methylcyclohexane or ethylcyclohexane, or an ester-based organic solvent such as butyl acetate) according to the base resin so as to obtain a desired thickness (e.g., 40 μm). The second resin layer 78$b$ is formed at any appropriate timing after the formation of the first resin layer 78$a$. In the illustrated example, the second resin layer 78$b$ is formed so as to cover the driver IC 48 and an external connection pad (OLB pad) 52, which are mounted on the display panel 40, in view of, for example, effectively suppressing the entry of the moisture although depending also on coating accuracy.

Figure 5:
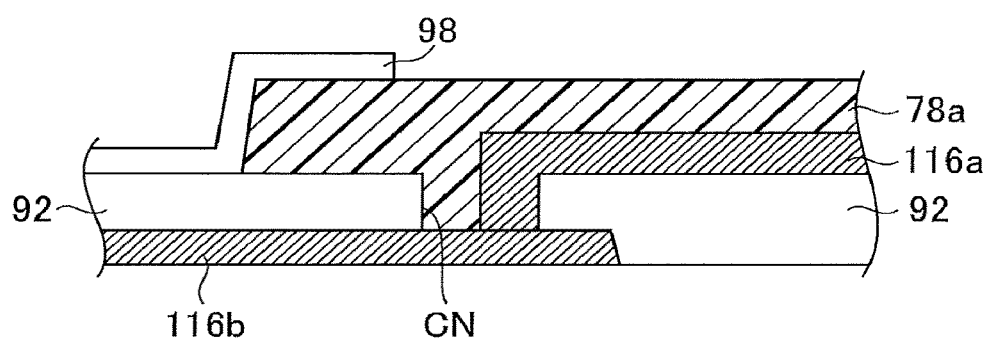
FIG. 5 is an enlarged view of a portion of a wiring line shown in FIG. 4.

As described above, the entry of moisture into the interior of the resin layer 78 can be suppressed, and therefore, it is, for example, possible to prevent the deterioration of the wiring line 116 covered by the resin layer 78 and thus suppress a trouble such as a lighting failure. The wiring line 116 formed in the circuit layer 74 may be defective in that the wiring line 116 does not have a desired wiring pattern. For example, as shown in FIG. 5, a first wiring line 116$a$ that does not satisfy a desired size of the wiring line cannot completely cover a contact hole CN formed in the interlayer insulating film 92, and the first resin layer 78$a$ covering the first wiring line 116$a$ may contact a second wiring line 116$b$ located below the contact hole CN. When the second wiring line 116$b$ is formed of a material different from that of the first wiring line 116$a$ and is more likely to deteriorate (e.g., due to moisture) than the first wiring line 116$a$, there is a risk that the moisture entering into the interior of the resin layer 78 reaches the second wiring line 116$b$ and thus causes a trouble such as a lighting failure. It can be mentioned as one of the causes of the occurrence of the defect that, for example, the amount of exposure of an exposure machine used in forming the wiring pattern is partially different (increased). One of the features of the invention is that, even when there is such a defect, the deterioration of the wiring line 116 is prevented and thus a trouble such as a lighting failure can be suppressed. In FIG. 5, the sealing layer 106 and the layers disposed below the interlayer insulating film 92 shown in FIG. 4 are omitted.

The invention is not limited to the embodiments, and various modifications can be made. For example, the configuration shown in the embodiments can be replaced with substantially the same configuration, a configuration providing the same operational effect, or a configuration capable of achieving the same object.

Various variations and modifications are conceivable by those skilled in the art within the scope of the idea of the invention, and it will be understood that all such variations and modifications also fall within the scope of the invention. For example, when those skilled in the art appropriately modify the embodiments described above by addition, deletion, or design change of components, or by addition, omission, or condition change of steps, all such modifications also fall within the scope of the invention as long as they include the gist of the invention.

What is claimed is:

1. A display device comprising:
   a base material containing resin and including a display region and a bent region, the display region including a plurality of pixels;
   a resin layer disposed on one side of the base material, wherein
   an exposed section where a surface of the resin layer on a side opposite to a side on which the base material is disposed is exposed is formed in at least the bent region, and
   the resin layer includes, in the exposed section, a first resin layer and a second resin layer whose hydrophilicity is lower than that of the first resin layer, in this order from the base material side; and
   a component provided on the side of the base material on which the resin layer is disposed, wherein the component is covered by the second resin layer.

2. The display device according to claim 1, further comprising a wiring line disposed between the base material and the resin layer and disposed from the display region over the bent region, wherein
   the wiring line and the resin layer are in contact with each other in at least the bent region.

3. The display device according to claim 1, wherein the first resin layer contains a polyimide-based resin and/or an acrylic-based resin.

4. The display device according to claim 1, wherein the second resin layer contains a styrene-based resin.

5. The display device according to claim 2, wherein the wiring line includes a first wiring line disposed on an interlayer insulating film formed over the base material, and a second wiring line electrically connected to the first wiring line through a contact hole formed in the interlayer insulating film, and
   the first resin layer covering the first wiring line is in contact with the second wiring line through the contact hole.

6. The display device according to claim 5, wherein a material forming the second wiring line is more likely to deteriorate than a material forming the first wiring line.

* * * * *